United States Patent [19]
Saito et al.

[11] 4,000,473
[45] Dec. 28, 1976

[54] ISOLATION AMPLIFIER

[75] Inventors: Masaru Saito, Fuchu; Shigemitsu Taguchi, Tama, both of Japan

[73] Assignee: Shoei Electric Co., Ltd., Tokyo, Japan

[22] Filed: June 9, 1975

[21] Appl. No.: 584,972

[30] Foreign Application Priority Data

June 9, 1974 Japan ............................ 49-65794
Nov. 4, 1974 Japan ............................ 49-127432

[52] U.S. Cl. .................................. 330/8; 330/10; 330/167
[51] Int. Cl.² ........................................ H03F 9/00
[58] Field of Search ............... 330/8, 10, 165, 167

[56] References Cited
UNITED STATES PATENTS 3,029,394  4/1962  Finnamore ............... 330/10 X
3,325,744  6/1967  Revesz et al. .............. 330/10 X

FOREIGN PATENTS OR APPLICATIONS 1,055,150  1/1967  United Kingdom ........... 330/8
684,626  12/1952  United Kingdom ........... 330/8

OTHER PUBLICATIONS

*Handbook of Operational Amplifier Active RC Networks*, p. 74, Burr–Brown Research Corp. Publication, copyright 1966.

*Primary Examiner*—James B. Mullins
*Attorney, Agent, or Firm*—Armstrong, Nikaido & Wegner

[57] ABSTRACT

Disclosed is an isolation amplifier, wherein a DC input signal is applied to the primary winding of a saturable reactor, the secondary winding of which is coupled with an oscillating circuit so as to supply the secondary circuit with a high-frequency current, and then the current flowing through the secondary winding is applied to a feed-back type low-pass filter, with which an output signal proportional to the DC input signal is extracted from the current flowing through the secondary winding.

4 Claims, 8 Drawing Figures

ISOLATION AMPLIFIER

BACKGROUND OF THE INVENTION

1. Field of the Invention

This invention relates to an isolation amplifier, or more in particular to an improved isolation direct current converter using a saturable reactor.

2. Description of the Prior Art

The conventional magnetic amplifier used as a DC amplifier with its primary and secondary sides electrically isolated from each other has so far been widely used in the field of industrial instrumentation due to its general advantages of ruggedness, high isolation characteristic between input and output, high ratio of noise rejection and the like. However, because of using a couple of magnetic cores, they are not only too expensive but also too troublesome to adjust the equilibrium between the magnetic characteristics of the cores. In addition, they have many disadvantages such as bulkiness, low responsiveness, narrow frequency band, insufficient linearity between the input and output, and necessity of actuating power supply, for instance, of 50 Hz to 60 Hz.

SUMMARY OF THE INVENTION

Accordingly, it is an object of the present invention to provide an improved isolation amplifier on the above-mentioned disadvantages of the conventional device.

In order to achieve the above-mentioned object, the isolation amplifier according to the present invention is so constructed that a DC input signal is applied to the primary winding of a saturable reactor having one magnetic core, the secondary winding of which is coupled to an oscillating circuit for supplying the secondary winding with a high-frequency current, and then the current flowing through the secondary winding is applied to a feed-back type low-pass filter, by which only the current component proportional to the DC input signal is extracted.

The isolation amplifier according to the present invention has a great many advantages, such as low production cost and elimination of the troublesome problem to adjust the equilibrium on the characteristics of magnetic core due to the employment of a single magnetic core, and further a high response speed, and reduction of the number of turns and the size of core due to the use of a high-frequency current as the current source for the secondary side. Also, the current flowing through the secondary side is composed of the current subject to the low of equal ampereturns with respect to the DC current flowing through the primary winding, and a carrier-current supplied from a high-frequency current source. By means of a low-pass active filter, only the DC component proportional to the DC input signal is extracted from the current flowing through the secondary side, resulting in a highly improved frequency characteristics over a wide range.

DESCRIPTION OF THE PREFERRED EMBODIMENTS

The present invention will be described in detail with reference to the accompanying drawings.

Figure 1:
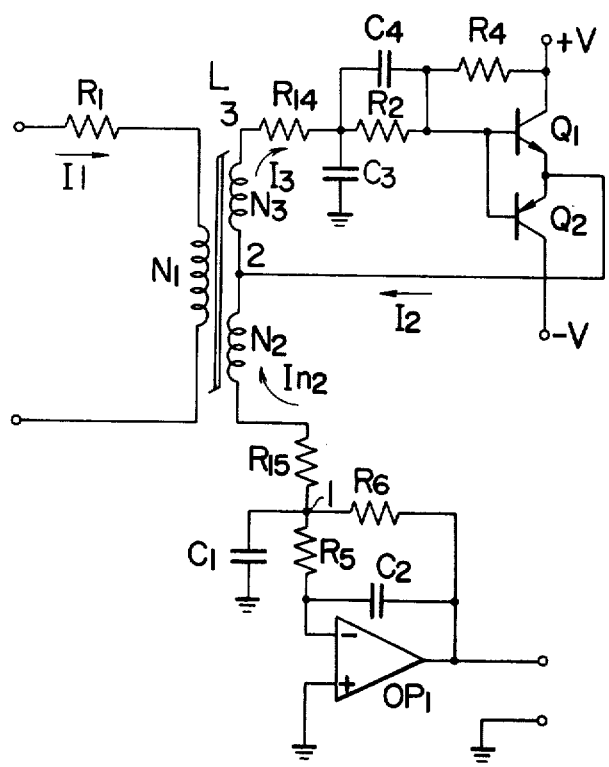
FIG. 1 is a circuit diagram showing a first embodiment of the present invention.

Referring first to FIG. 1 showing an example of the isolation amplifier circuit according to the present invention, a DC input signal is applied through an input resistor R1 to the primary winding N1 of a saturable reactor L with a single magnetic core of a rectangular saturation characteristic. The secondary winding N2 of the saturable reactor L is connected with an oscillation circuit, such as a DC-AC inverter, comprising a pair of switching transistors Q1 and Q2 and a DC power supply means in such a manner as to supply the secondary winding N2 with a high-frequency current. The current flowing through the secondary winding includes the high-frequency current and a DC current portion flowing through the secondary winding of the saturable reactor in accordance with the DC input signal, which is supplied to a feed-back type low-pass filter including an amplifier such as the operational amplifier OP1 and a feed-back circuit. The feed-back circuit comprises an input resistor R5, a feed-back resistor R6, a bypass capacitor C1 and a feed-back capacitor C2. Reference number R14 shows an integrating resistor, C3 an integrating capacitor, C4 a differentiating capacitor, R15 a load resistor, symbol +V a positive connection terminal of a DC power supply, and symbol −V a negative connection terminal of another DC power supply.

An amplifier including an active element such as 741 TYPE is used in the above-mentioned operational amplifier circuit, and the combination of the above-mentioned amplifier with the feed-back circuit such as described above thereby to form what is called an active filter having a very flat gain-frequency characteristic over a predetermined frequency range and having a gain characteristic that the gain reduces sharply at the maximum frequency. Also, because the operational amplifier OP1 combined with the feed-back circuit has its non-reverse input terminal grounded, the average electric potential at the junction point 1 of the resistors R5 and R6 and the bypass capacitor C1 is equal to the zero potential.

The self-exciting oscillation frequency of the oscillating circuit is not less tha 1 KHz, preferably 10 KHz to 20 KHz in the operation of the device according to the present invention. The operation of the embodiment under consideration will be described below.

When an external DC power source is connected to the isolation amplifier according to the present invention, the DC current is supplied to the base of transistor Q1 through the starting resistor R4, to energize the transistor Q1, so that a current flows into the junction point 1 through collector-emitter of the transistor Q1, the secondary winding N2 and resistor R15. The conducting state of the transistor Q1 and the cut-off state of the transistor Q2 are held by a voltage induced across the control winding N3, when the potential of the terminal 3 is positive with respect to terminal 2.

When the magnetic core of the reactor L is saturated by the current flowing through the secondary winding N2, the current I2 is increased. The reverse electromotive force is induced across the secondary winding N2, when the potential of terminal 3 is negative against the terminal 2, and consequently, the transistor Q1 is kept in the cut-off state and the transistor Q2 in the energized state. As a result, a current flows into the terminal-V through the junction point 1, the resistor R15, the secondary winding N2 and the emitter-collector of the transistor Q2.

Each time the saturable reactor L is saturated, the above-described operation is repeated, thus causing the self-exciting oscillation current I2 and I3 to flow through the windings N2 and N3 respectively.

The current flowing into the resistor R15 through the starting resistor R4 is constant in the absence of variations of the source voltage and causes an offset voltage in the output of the operational amplifier OP1. The amount of such a current, however, is negligibly small and will be ignored in the description below.

By the repetition of the above-mentioned operation, the oscillating circuit, namely, the DC-AC converter comprising the transistors Q1 and Q2, the secondary winding N2 of the reactor L and the control winding N3 is self-excited. The positive and negative portions of the waveform of the oscillation current are made to be symmetric by equalizing the absolute values of the source voltages +V and −V, if a small distortion due to the starting resistor R4 is ignored.

Figure 2:
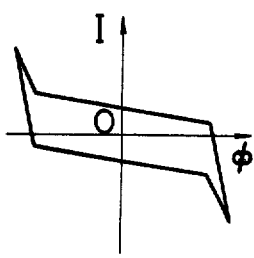
FIGS. 2 to 6 are characteristic diagrams for explaining the operation of the first embodiment.
Figure 3:
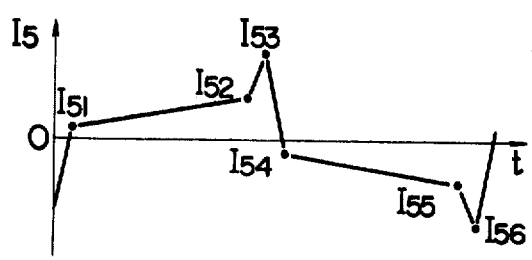

Assuming that the saturation characteristics of the magnetic core of the reactor L are as shown in FIG. 2 where the abscissa represents the magnetic flux density $\phi$ of the magnetic core and the ordinate the current I flowing through the winding N2, the oscillation currents (I2 − I3) has symmetric positive and negative portions in their waveform as shown in FIG. 3 where the abscissa represents time and the ordinate the current I5 flowing into the resistor 15.

When the DC input current I1 is supplied through the resistor R1 to the primary winding N1 of the saturable reactor, a DC current expressed as $I_{n2} = I1 \cdot (N1/N2)$ flows through the winding N2 according to the low of equal ampereturns. Therefore, if the composite current flowing from the secondary winding into the resistor R15 is I5, then $$I5 = I2 - I3 - I1 \, (N1/N2)$$

Because of waveforms of self-exciting oscillation current (I2 − I3) is symmetric, the average value of the self-oscillation current $(\overline{I2 - I3})$ is zero in one cycle. As a result, the average value of the composite current $\overline{I5}$ can be expressed as $$\overline{I5} = -(N1/N2)I1$$

Thus the resultant waveform of the current I5 is obtained by relocating the waveform in FIG. 3 parallel to the ordinate by I1 N1/N2). When the current having such a waveform is applied to the low-pass active filter, the operational amplifier OP1 produces an output voltage Vo $$V_o = -R6 \cdot \overline{I5} = R6 \cdot I1 \cdot (N1/N2).$$

which is proportional to the input current I1. The fact that the high-frequency oscillation circuit, namely, the DC-AC inverter is employed as the AC power supply for the secondary winding side results in the substantial overcoming of the disadvantages of the conventional device using the ordinary commercial power supply including the bulkiness, low response speed and insufficient linearity between input and output signal. The feed-back type low-pass filter according to the present invention, in case of using an ordinary operational amplifier such as 741 TYPE, is able to achieve a high response speed, wide frequency band, improved frequency characteristics and successful elimination of high harmonics noises.

Further, the use of the saturable reactor comprising an iron core wound with a single tape contributes to a compactness and low cost of the device according to the present invention as compared with the conventional device having a couple of magnetic cores and also eliminates the need for balance between the characteristics of the individual magnetic cores.

In the circuit according to the present invention, the various characteristics thereof may be improved by selecting the constants of the component elements thereof in the manner as mentioned below.

First, by lessening the value of the load resistor R15 and thereby increasing the value $|I53/I51|$ in FIG. 3, it is possible to improve the linearity between input and output signals and the stability.

Next, the instability of output characteristics which otherwise might occur due to changes in the phase of conduction and cut-off of the transistor in the presence of temperature changes is reduced as described below.

The differentiating capacitor C4 having a larger capacity than one for the ordinary purpose of improvement in speed is connected to the base circuit of the transistors Q1 and Q2. The differentiated output is used to forcibly energize and cut off the transistors Q1 and Q2, so that preventing the waveform of FIG 3, especially, the part thereof between I52 and I54 from changing with temperature, thus maintaining stable output regardless of temperature changes.

In addition, by appropriately selecting the number of turns of the winding N3 and thus properly increasing the voltage induced across the winding, the conduction and cut-off of the transistors Q1 and Q2 are maintained accurately, thereby stabilizing the output, irrespective of the changes in the base-emitter voltage of the transistors Q1 and Q2 with respect to temperatures. Furthermore, when the capacitance of the integrating capacitor C3 is selected at a value more than a certain level, the transistor Q1 (or Q2) is adjusted to be turned on after the transistor Q2 (or Q1) is turned off, thus preventing the simultaneous conduction of the transistors Q1 and Q2. In this way, the variations in the output voltage due to the variations in the source voltage are suppressed, and at the same time the occurrence of noises is reduced.

Figure 4:
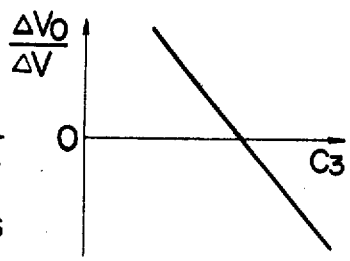
Figure 5:
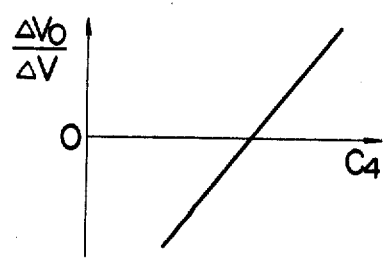

The graph of FIG. 4 shows the relationship between the ratio of $\Delta Vo$ of the output voltage to the variations $\Delta V$ of the source voltage, taken along the ordinate, and the capacitance, taken along the abscissa, of the integrating capacitor C3, while maintaining constant the values of the capacitor C4 and the resistor R15. The graph of FIG. 5 shows $\Delta Vo/\Delta V$ as against the varying capacitance of the differentiating capacitor C4 while maintaining the values of the capacitor C3 and resistor R15 to be constant. Also, the relationship between the resistance of the resistor R15 taken along the abscissa and the value $\Delta Vo/\Delta V$, while maintaining the capacitance values of the capacitors C3 and C4 to be constant, is illustrated in FIG. 6.

Figure 6:
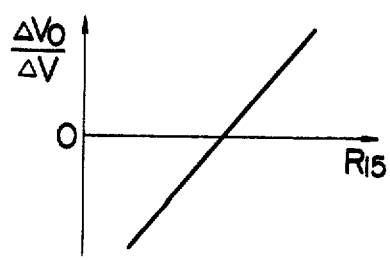

As shown in FIGS. 4 to 6 for the relationship between the capacitance of the capacitor C3 or C4 or resistance of the resistor R15 and the ratio $\Delta Vo/\Delta V$, the value $\Delta Vo/\Delta V$ may be lessened easily to a considerable degree by appropriately selecting the values of the capacitors and resistors.

Figure 7:
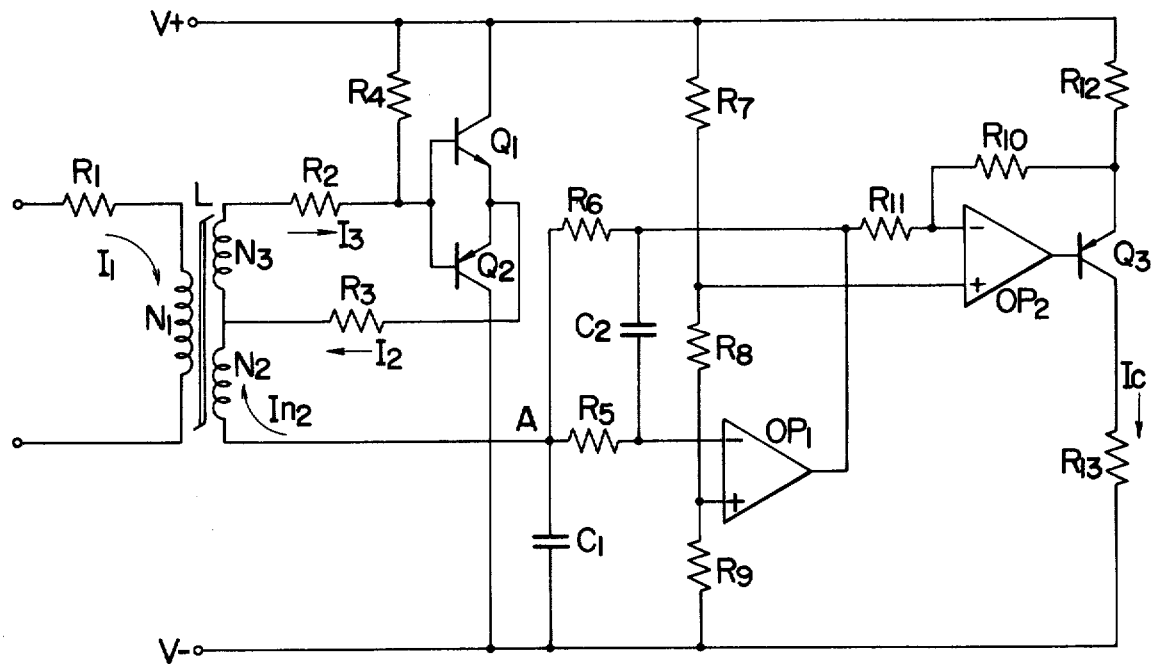
FIG. 7 is a circuit diagram showing a second embodiment of the present invention.

The second embodiment of the invention is illustrated in FIG. 7. In the drawing under consideration, reference alphameric symbols show the same symbols as in FIG. 1. Symbol V+ shows a positive connection terminal of a DC power supply, V− a negative connection terminal, R7, R8 and R9 voltage-dividing resistors, OP2 an operational amplifier, R10 a feedback resistor, R11 an input resistor, Q3 a transistor, R12 an emitter resistor, and R13 an output resistor.

When the values of the voltage-dividing resistors R7, R8 and R9 are selected as $$R7 = R8 = \tfrac{1}{2} R9,$$

then the potential at the point A is V/2 or one half the DC source voltage V.

In this embodiment, assuming that the average value of the composite current I0 flowing into point A through the secondary winding is $\overline{I0}$, the expression $$\overline{I0} = - (N1/N2) \cdot I1$$

is obtained as in the first embodiment.

The operational amplifier circuit OP1 which constituting a low-pass filter produces the output voltage $e0$ which can be expressed as follows:

$$e0 = (V/2) + (N1/N2) \cdot I1 \cdot R6$$

Let the input voltage of the operational amplifier OP2 be $e1$ and the output voltage thereof $e2$, and $$(e0 - e1)/R11 = (e1 - e2)/R10$$

and further, if the relation is selected so that $R11 = R10$ $$e0 - e1 = e1 - e2$$

$$e2 = 2e1 - e0$$

Since the input voltage $e1$ is equal to the divided voltage $(\tfrac{3}{4})V$ at the junction point of the resistors R7 and R8, $$e2 = (3/2) V - e0 = V - (N1/N2) \cdot I1 \cdot R6$$

Selecting the transistor having the current amplification factor $\beta >> 0$ as the transistor Q3 and at the same time selecting the values of the resistors R10 and R12 which are so related as to be R10 >> R12, the collector current of the transistor Q3 may be enlarged while the base current thereof being ignored. Therefore, $$Ic = (V - e2/R12) = (R6/R12) \cdot (N1/N2) \cdot I1,$$

where Ic is the collector current of the transistor Q3.

In other words, the collector current Ic of the transistor Q3 is proportional to the input current I1.

In view of the fact that the input and output are isolated from each other by the saturable reactor L, the circuit under consideration is suitably applied to the amplifier circuit for control or instrumentation.

In the present invention, the input resistance of the operational amplifier OP1 is so large that the resistance values of the voltage-dividing resistors R7 to R9 are ignorable. The output of the operational amplifier OP1 is fed back through the resistor R6 in such a manner as to maintain the potential of point A at half the DC source voltage. Also, capacitors C1 and C2 suppresses AC potential variation at point A. For these reasons, point A acts as a stable middle point with low impedance so as to stabilize the oscillating operation of the self-oscillating circuit comprising the switching transistors Q1 and Q2 and the saturable reactor L.

In the first embodiment, the output is subjected to variation due to the unbalance between the absolute values of the positive and negative source voltages. On the contrary, since in the second embodiment, the divided voltages at the junction point of the resistors R8 and R9 is used as a hypothetically grounded potential instead of using the two sources as the working power supplies, it is almost improbable that the unbalance of voltages occurs, thus maintaining a high accuracy easily.

Figure 8:
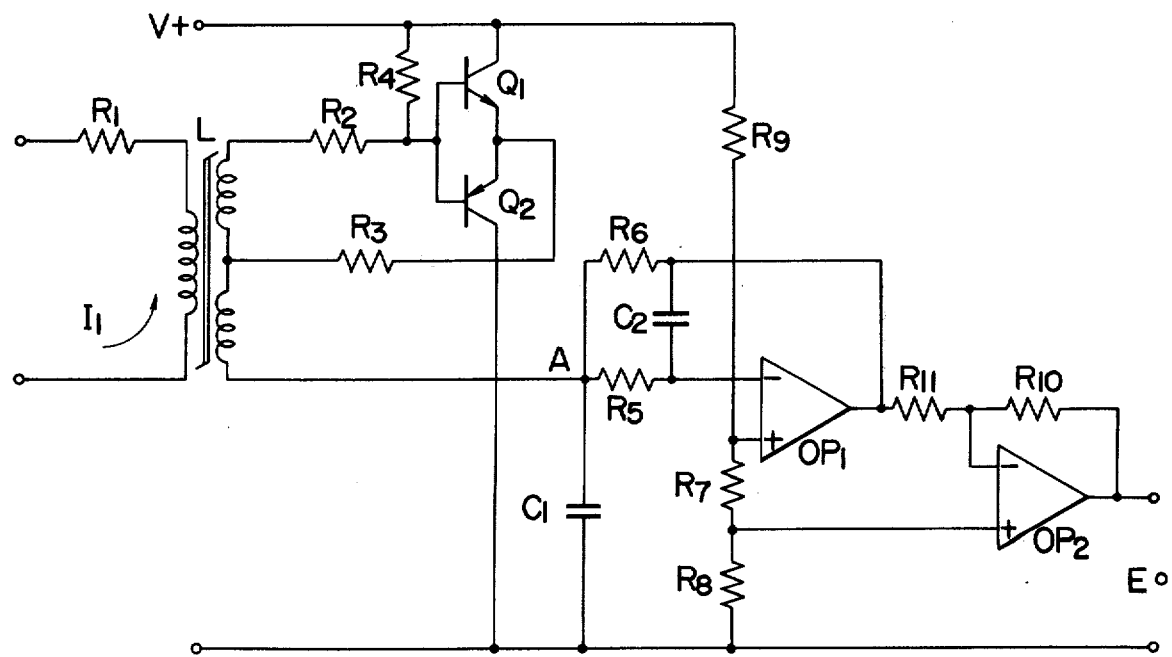
FIG. 8 is a circuit diagram showing a third embodiment of the present invention.

The above-described construction of the second embodiment is of current output type. The third embodiment having the construction of voltage output type will be explained below with reference to FIG. 8, in which reference alphameric symbols are the same as in FIG. 7.

Similarly to the embodiment of FIG. 7, a self-exciting oscillating circuit comprising the switching transistors Q1 and Q2 and the saturable reactor L comes into operation on setting the voltage-dividing resistors R7 to R9 in such a manner as to achieve the relation $$R7 = R8 = \tfrac{1}{2} R9$$

also in the embodiment under consideration. In spite of this, the input current I1 is made to flow in the direction opposite to that in the embodiment of FIG. 7, so that the average value $\overline{I0}$ of the composite current flowing into the input resistor R5 from the point A can be expressed as $$\overline{I0} = (N1/N2) \cdot I1$$

As a result, the output voltage of the operational amplifier OP1 is $$e0 = (V/2) - (N1/N2) \cdot I1 \cdot R6$$

If the relation between the resistors R10 and R11 is so selected, like the preceding embodiment, as to be $$R10 = R11$$

then there are following relations $$e0 - e1 = e1 - E0$$

$$E0 = 2e1 - e0$$

among the output voltage $e0$ of the operational amplifier OP1, the input voltage $e1$ of the operational amplifier OP2 and the output voltage E0 thereof.

Since the input voltage e1 is equal to the divided voltage $\tfrac{3}{4}$ V at the junction point of the voltage-dividing resistors R7 and R8, $$E0 = \tfrac{3}{2} V - \tfrac{1}{2} V + (N1/N2) \cdot I1 \cdot R6 = (N1/N2) \cdot I1 \cdot R6,$$

that is, the output voltage E0 of the operational amplifier OP2 is proportional to the input current I1.

It will be understood from the foregoing description that this invention makes an isolation amplifier to be simple in construction, low in cost, wide in frequency band, superior in frequency characteristics and high in accuracy, by combining a high-frequency oscillating circuit composed of a saturable reactor of one magnetic core, two pieces of transistors, a DC power supply or two, with a feed-back type low-pass active filter. There have other advantages, such as the sufficient linearity between input and output signals, high stability against changes in temperature or source voltage and low noises. For these reasons, the isolation amplifiers according to the present invention are quite suitable for use as an amplifier circuit for control or instrumentation.

We claim:
1. An isolation amplifier circuit comprising:
   a. a saturable reactor having a single core wound with a primary, secondary and a control winding therearound, said primary winding being connected to a terminal means for receiving a DC input signal, and said secondary and control windings being connected in series,
   b. a circuit means connected to one end of said control winding to form a high-frequency oscillator circuit with said secondary and control winding for supplying said secondary winding with a high-frequency current, and
   c. a feedback current input type low-pass filter connected to the free end of said secondary winding.

2. An isolation amplifier according to claim 1, wherein said circuit means includes a first and second transistor connected in series, and further includes a driving means for actuating said first and second transistors alternately in combination with said control winding.

3. An isolation amplifier according to claim 1, wherein said feedback, current input type low-pass filter includes an operational amplifier and a filter circuit, said filter circuit being connected between the output and the inverting input terminal of said operational amplifier.

4. An isolation amplifier according to claim 2, wherein said feedback, current input type of low-pass filter includes an operational amplifier and a filter circuit, said filter circuit being connected between the output and the inverting input terminal of said operational amplifier.

* * * * *